United States Patent [19]

Hata et al.

[11] Patent Number: 4,908,690

[45] Date of Patent: Mar. 13, 1990

[54] SEMICONDUCTOR INTEGRATED CIRCUIT DEVICE WITH HIGH RELIABILITY WIRING LAYERS

[75] Inventors: Masayuki Hata; Hiromasa Nakagawa, both of Itami, Japan

[73] Assignee: Mitsubishi Denki Kabushiki Kaisha, Tokyo, Japan

[21] Appl. No.: 106,880

[22] Filed: Oct. 13, 1987

[30] Foreign Application Priority Data

Oct. 29, 1986 [JP] Japan .................. 61-259020

[51] Int. Cl.$^4$ ........................... H01L 23/48
[52] U.S. Cl. ......................... 357/68; 357/41
[58] Field of Search ...................... 357/68, 41

[56] References Cited

U.S. PATENT DOCUMENTS 4,060,828 11/1977 Satonaka .................. 357/68
4,740,825 4/1988 Saeki ....................... 357/68

FOREIGN PATENT DOCUMENTS 67937 11/1981 Japan .

OTHER PUBLICATIONS

"Stress Analysis of Passivation Film Crack for Plastic Molded LSI Caused by Thermal Stress", S. Okikawa et al, Musashi Works, Hitachi Ltd., 1450, Josuihon-cho, Kodaira-shi, Tokyo, 187 Japan, ISFTA (1983), pp. 275-280.

Primary Examiner—Frank Gonzalez
Attorney, Agent, or Firm—Nixon & Vanderhye

[57] ABSTRACT

A semiconductor integrated circuit device includes a semiconductor substrate and a wiring layer formed on the substrate. An output buffer transistor is provided with its gate formed along the direction of the wiring. The resulting device has improved area efficiency and is less susceptible to wiring element slide without requiring slits to be formed in the wiring structure—and thus also has lower current density.

12 Claims, 2 Drawing Sheets

SEMICONDUCTOR INTEGRATED CIRCUIT DEVICE WITH HIGH RELIABILITY WIRING LAYERS

FIELD OF THE INVENTION

The present invention relates to semiconductor integrated circuit devices and, particularly, to semiconductor integrated circuit devices adapted to prevent aluminum wirings from sliding and cracking in passivation.

BACKGROUND OF THE INVENTION

FIG. 3 is a view of a wide aluminum wiring layer of a conventional semiconductor integrated circuit device disclosed, for example, in Japanese Patent Application No. 144,176/1979 (Laid open no. 67937/1981). In FIG. 3, the conventional aluminum wiring layer includes aluminum power wiring 1, aluminum ground wiring 2, and slits 3 cut out of the power wiring 1 and the ground wiring 2.

A molded package type semiconductor integrated circuit device having such aluminum wiring develops contraction stress applied from the mold to the circuit device. This stress is absorbed by the slits 3 to reduce the sliding of the aluminum wiring (hereinafter referred to as "aluminum wiring slide"). It is known that increasing the number of the slits decreases the likelihood of aluminum wiring slide occurring. However, while the slits 3 are a good countermeasure to prevent aluminum wiring slide, they are disadvantageous in that they cause current density to increase due to reduction in the effective wiring cross-section (width) as compared with wiring having no slits.

In the conventional semiconductor integrated circuit described above, the wiring widths must be increased as compared to wiring having no slits in order to provide the same current density. That is, the power wiring 1 and the ground wiring 2 must be widened. Since an output buffer transistor for driving an external pin of the device cannot be formed at an arbitrary point under the wirings parts 1 and 2 due to the slits 3, the conventional integrated circuit requires greater area on the substrate. Further, when the distance between the slits 3 is increased to prevent increase in the current density, the possibility of aluminum wiring slide increases.

Heretofore, a bulk contact was used only as a well for forming a transistor. A substrate near the well was used to stabilize the substrate and the well so as to eliminate aluminum wiring slide.

Aluminum wirings were heretofore connected to a lower layer via a through hole or a contact, and an uneven portion was presented under the aluminum wirings. For example, an uneven portion is formed at the crossing and not crossing portions between the bit line and the word line of a DRAM.

The width of aluminum wiring is discussed in "Stress Analysis of Passivation Film Crack for Plastic Molded LSI Caused by Thermal Stress" by S. Okikawa in ISTFA (International Symposium for Testing and Failure Analysis), 1983, pp. 275-280. This paper provides the following conclusions:

(1) The stress of resin in the form of shearing stress on the surface of a chip becomes 9.5 kg/mm$^2$ at the corner of the chip.

(2) The strength of the passivation film is proportional to bending strength and inversely proportional to the square of the aluminum width.

(3) To prevent a passivation crack, it is preferable to divide the aluminum width into several tens of microns at the corner of a chip subject to large shearing stress. According to the inventor's experiments, passivation cracks as large as 30 microns may occur.

SUMMARY OF THE INVENTION

An object of the present invention is to provide a semiconductor integrated circuit device which eliminates the above mentioned drawbacks, improves area efficiency, and prevents aluminum wiring slide without requiring slits in the aluminum wiring.

In order to achieve these and other objects, there is provided according to an aspect of the present invention a semiconductor integrated circuit device having a semiconductor substrate, and wiring formed in a wiring direction. The gate wiring for an output buffer transistor is formed along the wiring direction on a lower wiring layer (which is in turn formed on the semiconductor substrate).

According to another aspect of the present invention, there is provided a semiconductor integrated circuit device having an output buffer transistor including aluminum wiring formed from the second aluminum layer provided in a two-layer aluminum wiring structure. The aluminum wiring is connected via a through hole to the source of the output buffer transistor.

According to still another aspect of the present invention, there is provided a semiconductor integrated circuit device having a semiconductor substrate comprising a wiring layer formed on the substrate and connected by way of a bulk contact via a through hole to the substrate or to a well.

When the semiconductor integrated circuit device provided by the invention is disposed within a molded package, contraction stress applied from the mold to the circuit device does not cause aluminum slide. This is because the wiring is fixed due to the gate of the output buffer transistor disposed at the lower wiring layer or the through hole so that no aluminum wiring slide occurs. In addition, the area efficiency of the circuit device is improved and current density is reduced.

BRIEF DESCRIPTION OF THE DRAWINGS

These and other features and advantages of the present invention will be better and more completely understood by referring to the following detailed description of presently preferred exemplary embodiments in conjunction with the appended sheets of drawings, of which.

DETAILED DESCRIPTION OF THE PREFERRED EMBODIMENTS

Figure 3:
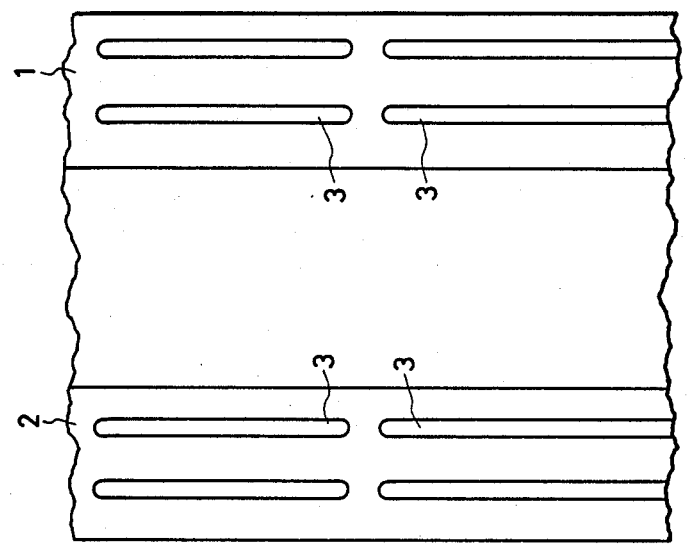
FIG. 3 is a plan view of a prior art semiconductor integrated circuit device.
Figure 1:
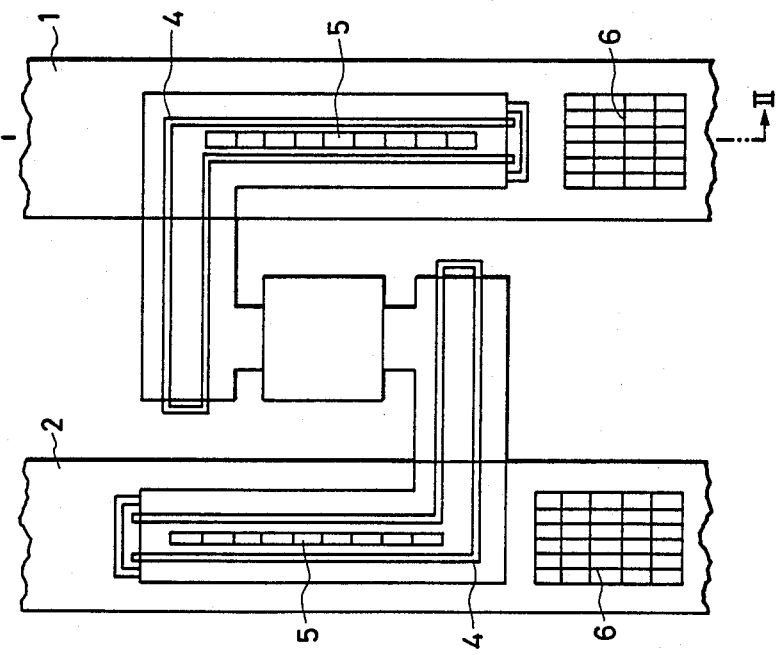
FIG. 1 is a plan view of a presently preferred exemplary embodiment of a semiconductor integrated circuit device in accordance with the present invention.

A preferred embodiment of a semiconductor integrated circuit device in accordance with the invention is shown in FIG. 1. FIG. 1 is a plan view showing an embodiment in which the output buffer of a complementary semiconductor integrated circuit device is manufactured at the same time a two-layer aluminum wiring structure is produced in the semiconductor integrated circuit device.

In FIG. 1, the semiconductor integrated circuit device comprises a two-layer wiring structure comprising a first (lower) aluminum wiring layer and a second (upper) aluminum wiring layer. The wiring structure includes power wiring 1 comprising the second (upper) aluminum wiring layer formed in the process of producing two-layer aluminum wiring. The structure further includes aluminum ground wiring 2, and an output buffer transistor gate 4, extended along the wiring direction, on the lower wiring layer of the ground wiring 2. A through hole and contact 5 connects lower aluminum wiring layer to the upper aluminum wiring layer. Contact 5 supplies electric power to the source 18 (not shown in FIG. 1) of the output buffer transistor and to connect the upper aluminum wiring layer to a diffused region 9. A through hole and bulk contact 6 supplies electric power to a semiconductor substrate 10 or to a well when no output buffer transistor exists.

With such semiconductor integrated circuit device construction, the output buffer transistor is formed on the lower layers of the power wiring 1 and the ground wiring 2. Thus, the areas of the power and ground wiring may be reduced. The power wiring 1 and the ground wiring 2 are wired on an uneven state of the gate 4 at the lower layer, and are also fixed to the lower layer due to the through hole and contact 5 and the through hole and bulk contact 6. Therefore, aluminum wiring slide does not occur. Since the aluminum of the power wiring 1 and the ground wiring 2 are formed without slits, current density can be kept to a low value and the potentials of the substrate and the well can be stabilized due to the bulk contact 6.

Figure 2:
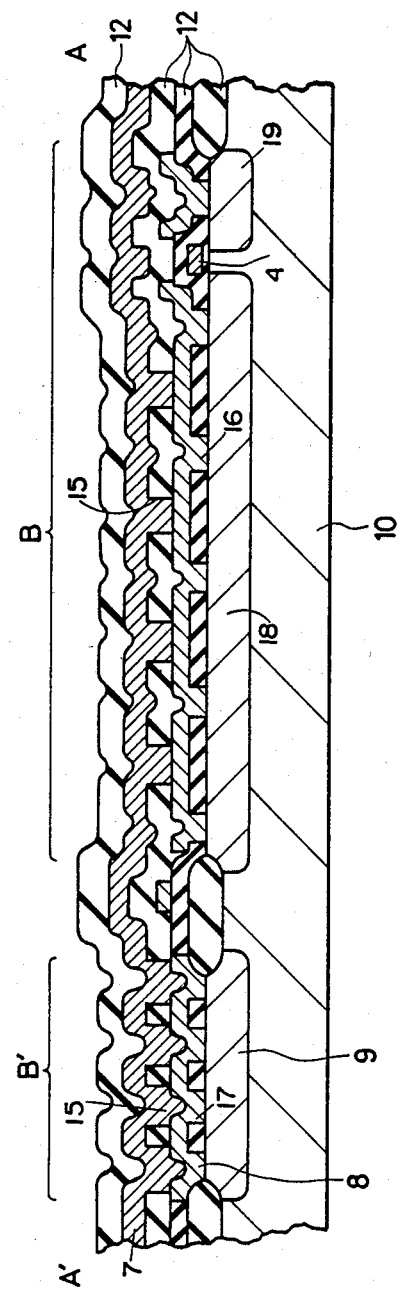
FIG. 2 is a sectional view of the FIG. 1 embodiment taken along the line II—II in FIG. 1.

FIG. 2 is a sectional view taken along the line II—II in FIG. 1. The semiconductor integrated circuit device comprises an upper aluminum layer 7 (the wiring portion formed of second aluminum produced in the step producing a two-layer aluminum structure), a lower aluminum layer 8, a diffused layer 9, a substrate 10, a gate layer 4, and a silicon oxide insulating layer 12. Contact holes and through holes 16 for contacts 5 are superposed at bulk contact side B', and contact holes and through holes are not superposed at transistor side B. Thus, the upper aluminum wiring 7 is formed on the uneven portion to allow the upper aluminum to intrude into the recesses of the uneven portion to distribute stress forces—thereby preventing the aluminum wiring from sliding. When the through holes 16 are formed in this manner, the upper aluminum 7 is fusion-bonded to the lower aluminum 8 so that the two layers do not move with respect to one another under the influence of stress forces. When the aluminum is moved with respect to the silicon oxide layer 12, the strength of the stress is generally sufficient to cause damage to the chip. In case of the aluminum wiring slide, the strength of the stress is much weaker.

The bulk contact (6) 17 serves to connect the diffused layer 9 to the lower aluminum 8. The polarity of ions to be implanted in the diffused layer is different from the conductivity of the contact 5. In other words, the bulk contact (6) 17 stabilizes the potential of the substrate or the well, and the contact 5 (16) connects the diffused source layer 18 to the lower aluminum layer 8.

According to the preferred embodiment of the present invention as described above, the semiconductor integrated circuit device includes an output buffer transistor having its gate 4 formed along the wiring direction of the lower wiring layer 8 on the semiconductor substrate 10. Therefore, the wiring for the gate 4 is disposed on the uneven state to eliminate aluminum wiring slide and passivation cracks even when disposed within a molding package—thus improving area efficiency and reducing current density.

The semiconductor integrated circuit device upper and lower aluminum layers 7,8 are connected via the through hole 5 to the source 18 of the output buffer transistor (or the lower wiring layer 8 formed on the substrate 10 and connected by way of the bulk contact 17 via the through hole to the substrate 10 or the well). Therefore, the wiring is fixed to the underlying structure due to the through hole 5, eliminating aluminum wiring slide and passivation cracks as described above.

What is claimed is:

1. A semiconductor integrated circuit device including a semiconductor substrate 10, an insulating layer 12 formed thereon and having a plurality of contact holes 16 and bulk contact holes 17 and a wiring portion 7,8 formed on said insulating layer 12 and extending in a direction, comprising at least a MOS field effect transistor having a source 18 and a drain 19 both formed in said substrate 10 and a gate 5 formed between said substrate and said wiring portion and extending substantially in parallel with the direction of said wiring portion.

2. The semiconductor integrated circuit device as claimed in claim 1, wherein:
   said wiring portion includes an upper aluminum layer 7 and a lower aluminum layer 8; and
   said device further includes a further insulating layer separating said upper aluminum layer from said lower insulating layer, said further insulating layer having at least one through hole, said upper aluminum layer being connected through said through hole and said contact hole to said source of the transistor.

3. A semiconductor integrated circuit device as claimed in claim 2, wherein said upper aluminum layer is connected through said through-hole and said bulk contact hole to one of the substrate and a well.

4. A semiconductor integrated circuit structure of the type including a transistor having a source, a drain and a gate, said structure including:
   a semiconductor substrate;
   an insulating layer disposed on said substrate, said insulating layer having at least one contact hole (16) and at least one bulk contact hole (17) therethrough; and
   a wiring structure disposed on said insulating layer, said wiring structure having an elongated portion extending in a first direction, said wiring structure including a wiring portion means, coupled to said transistor gate and disposed between said substrate and said wiring structure and extending substantially parallel to said first direction, for preventing sliding of said wiring structure.

5. A structure as in claim 4 wherein:
   said structure includes a bulk contact area and a transistor area, said contact hole and bulk contact hole being disposed in said bulk contact area, said transistor source, drain and gate being disposed in said transistor area, said bulk contact area and said transistor are together defining an uneven portion having recesses; and
   said wiring structure includes an upper wiring layer and a lower wiring layer, said upper wiring layer being formed on said uneven portion and intruding into said recesses to thereby distribute stress forces and prevent said wiring structure from sliding with respect to said substrate.

6. A structure as in claim 4 wherein said wiring structure is formed with no slits defined therein.

7. A structure as in claim 4 wherein:
said wiring structure includes a first aluminum wiring layer and a second aluminum wiring layer, said first and second wiring layers being fusion bonded together.

8. A structure as in claim 4 wherein said structure further includes:
a diffused region disposed within said substrate; and
bulk contact means disposed within said bulk contact hole for connecting said wiring structure to said diffused region and for stabilizing the potential of said substrate.

9. A structure as in claim 8 wherein said structure further includes:
a further diffused region disposed within said substrate; and
contact means disposed within said contact hole for connecting said wiring structure to said further diffused region.

10. A structure as in claim 4 wherein said structure further includes:
a diffused region disposed within said substrate; and
contact means disposed within said contact hole for connecting said wiring structure to said further diffused region.

11. A structure as in claim 4 wherein:
said transistor source is disposed in said substrate;
said wiring structure includes first and second wiring layers;
said circuit structure further includes a further insulating layer separating said first and second wiring layers, said second wiring layer being disposed on said further insulating layer, said first wiring layer being disposed beneath said further insulating layer; and
means disposed in said contact hole for connecting said first wiring layer to said transistor source and for preventing said first wiring layer from sliding with respect to said substrate.

12. A semiconductor integrated circuit structure including:
a semiconductor substrate;
a transistor source region disposed in said substrate;
a transistor drain region disposed in said substrate;
a transistor gate structure operatively coupled to said source region and said drain region;
an insulating layer disposed on said substrate said insulating layer having at least one contact hole means (16) and at least one bulk contact hole means (17) therethrough, said contact hole means and said bulk contact hole means each for permitting electrical contact to be established between a wiring structure and said substrate;
said wiring structure disposed on said insulating layer, said wiring structure having an elongated portion extending in a first direction;
wherein said transistor gate structure comprises means disposed between said substrate and said wiring structure and extending substantially parallel to said first direction, for preventing sliding of said wiring structure.

* * * * *